(12) United States Patent
Coffy et al.

(10) Patent No.: US 8,716,739 B2
(45) Date of Patent: May 6, 2014

(54) OPTICAL ELECTRONIC PACKAGE WITH AN OPTICALLY ISOLATED CHAMBER

(71) Applicant: STMicroelectronics (Grenoble 2) SAS, Grenoble (FR)

(72) Inventors: Romain Coffy, Saint Martin le Vinoux (FR); Julien Vittu, Villard de Lans (FR)

(73) Assignee: STMicroelectronics (Grenoble 2) SAS, Grenoble (FR)

( * ) Notice: Subject to any disclaimer, the term of this patent is extended or adjusted under 35 U.S.C. 154(b) by 0 days.

(21) Appl. No.: 13/629,872

(22) Filed: Sep. 28, 2012

(65) Prior Publication Data

US 2013/0079068 A1  Mar. 28, 2013

(30) Foreign Application Priority Data

Sep. 28, 2011 (FR) ...................... 11 58691

(51) Int. Cl.
- *H01L 33/00* (2010.01)
- *H01L 27/15* (2006.01)
- *H01L 31/12* (2006.01)

(52) U.S. Cl.
USPC ................. 257/98; 257/82; 257/100

(58) Field of Classification Search
USPC ............... 257/82, 98, 99, 100, 723, 685, 686, 257/777, 787, 790
See application file for complete search history.

(56) References Cited

U.S. PATENT DOCUMENTS

| | | |
|---|---|---|
| 5,130,531 A | 7/1992 | Ito et al. |
| 2010/0127296 A1 | 5/2010 | Hioki et al. |
| 2010/0258710 A1 | 10/2010 | Wiese et al. |
| 2012/0049390 A1* | 3/2012 | Shimooka et al. ............ 257/790 |

FOREIGN PATENT DOCUMENTS

EP  1882908 A2  1/2008

OTHER PUBLICATIONS

INPI Search Report and Written Opinion for FR1158691 mailed May 23, 2012 (7 pages).

* cited by examiner

*Primary Examiner* — Matthew Reames
*Assistant Examiner* — Dilinh Nguyen
(74) *Attorney, Agent, or Firm* — Gardere Wynne Sewell LLP

(57) ABSTRACT

A package includes a substrate with an attached emitting IC chip and receiving IC chip. The emitting IC chip includes an optical emitter, and the receiving IC chip includes a main optical sensor and a secondary optical sensor. A case is provided with a bottom portion and a peripheral wall portion to cover the IC chips, wherein the edge of the peripheral wall portion is mounted to the substrate. The bottom portion of the case includes a main opening above the main optical sensor and a secondary opening above the optical emitter. An opaque material is interposed between the case and the receiving IC chip to isolate the main optical sensor from the secondary optical sensor and delimiting a chamber containing the secondary optical sensor and the optical emitter. The chamber is optically isolated from the main optical sensor and main opening, and may be filled with a transparent material.

22 Claims, 4 Drawing Sheets

US 8,716,739 B2

OPTICAL ELECTRONIC PACKAGE WITH AN OPTICALLY ISOLATED CHAMBER

PRIORITY CLAIM

This application claims priority from French Application for Patent No. 1158691, filed Sep. 28, 2011, the disclosure of which is hereby incorporated by reference.

TECHNICAL FIELD

The present invention relates to the field of electronic packages comprising optical electronic devices.

BACKGROUND

An electronic package is known which comprises a mounting plate, a first integrated circuit chip provided with a first optical detector, a second integrated circuit chip provided with a second optical detector and a third integrated circuit chip provided with an optical emitter, these three chips being bonded onto the mounting plate. An opaque cover is bonded onto the periphery of the mounting plate and optically isolates each of the chips because of the existence of three separate chambers. The cover has three separate openings, formed opposite the aforesaid three optical elements and provided with three transparent protective plates.

SUMMARY

An embodiment proposes an electronic package which is generally simpler and consequently less expensive.

An electronic package is proposed which comprises a substrate slice having a front face and a rear face; an emitting integrated circuit chip having a rear face fixed onto the front face of the substrate slice and comprising, in a front face, an optical light radiation emitter; and a receiving integrated circuit chip having a rear face fixed onto the front face of the substrate slice and comprising, in a front face, at least one main optical light radiation sensor and a secondary optical light radiation sensor.

The proposed electronic package comprises a basin-shaped case having a bottom and a peripheral wall, covering said chips at a distance, the edge of the peripheral wall of the case being fixed to the front face of the substrate slice, the bottom of the case having a main opening above the main optical sensor and a secondary opening above the optical emitter.

The proposed electronic package comprises at least a medium in the form of a bead made of an opaque material interposed between the case and the receiving chip, passing between the main optical sensor and the secondary optical sensor and delimiting a chamber containing the secondary optical sensor and the optical emitter and optically isolated with respect to the main optical sensor and to the main opening, said secondary opening emerging into said chamber.

The case can comprise at least a frame fixed onto the substrate slice and forming said peripheral wall and at least a plate fixed onto this frame and forming said bottom.

The bottom of the case can comprise a first plate fixed onto the frame and a second plate fixed onto the first plate.

The second plate can comprise main and secondary openings larger than the main and secondary openings of the first plate.

A transparent chip can be mounted above the main optical sensor.

Said medium in the form of a bead can obstruct the space between the main opening and the transparent chip.

A transparent medium encapsulating the emitting chip can be provided.

Said transparent medium can obstruct the secondary opening of the case.

There is also proposed a portable or mobile telephone internally comprising a package according to any one of the above claims, in which the shell of the telephone has at least one opening situated at least opposite at least one of said openings.

BRIEF DESCRIPTION OF THE DRAWINGS

Electronic packages according to the present invention will now be described as non-limiting examples, with reference to the appended drawing in which.

DETAILED DESCRIPTION OF THE DRAWINGS

Figure 1:
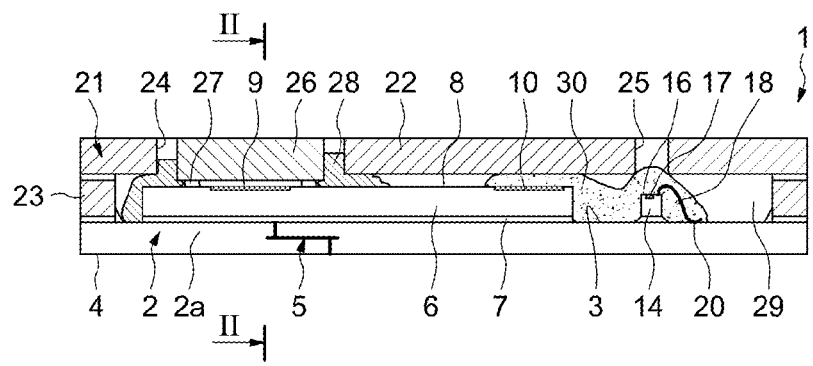
FIG. 1 shows a longitudinal cross-section of an electronic package.
Figure 2:
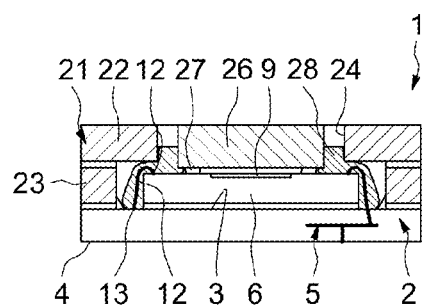
FIG. 2 shows a transverse cross-section through II-II of the electronic package of FIG. 1.
Figure 3:
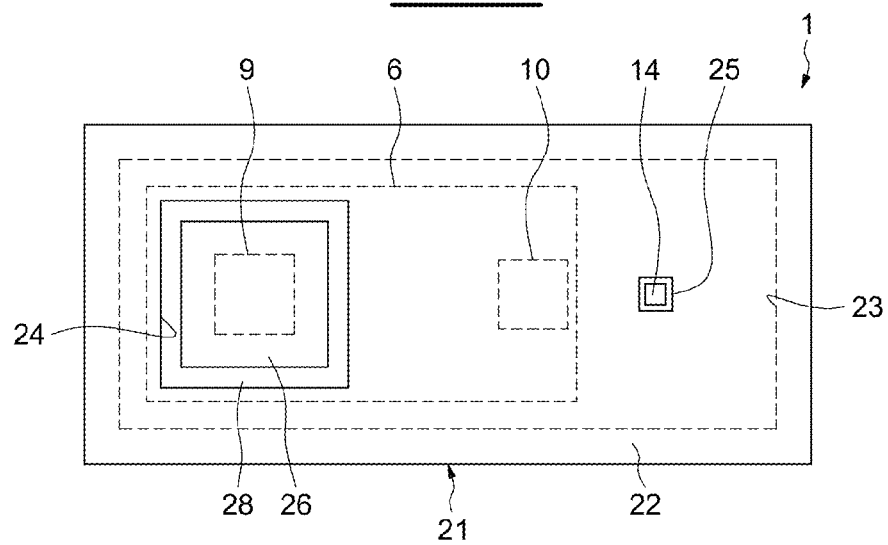
FIG. 3 shows a plan view of the electronic package of FIG. 1.

As shown in FIGS. 1 to 3, an electronic package 1 comprises an opaque substrate slice 2 which has opposite front and rear faces 3 and 4 and which comprises an electrically insulating material 2a and an integrated electrical connection network 5 making it possible to produce electrical connections from one face to the other and at the level of the faces 3 and 4.

The electronic package 1 comprises a receiving integrated circuit chip 6 whose rear face 7 is fixed onto the front face 3 of the substrate slice 2, for example by the intermediary of a layer of adhesive, and whose front face 8 comprises, on spaced zones, at least one main integrated optical light radiation sensor 9 and at least one second integrated optical light radiation sensor 10, spaced with respect to each other.

The receiving chip 6 is electrically connected to the electrical connection network 5 of the substrate slice 2 by the intermediary of a plurality of electrical connection wires 11 which selectively connect contacts 12 of the front face of the integrated circuit chip 6 and contacts 13 of the front face 3 of the substrate slice 2.

The electronic package 1 comprises an emitting integrated circuit chip 14 whose rear face 15 is fixed onto the front face 3 of the substrate slice 2, for example by the intermediary of a layer of conductive adhesive, and whose front face 16 comprises, on a zone, an integrated optical emitter 17 capable of emitting light radiation forward from its front face 16.

The emitting chip 14 is electrically connected to the electrical connection network 5 of the substrate slice 2 by the intermediary of at least one electrical connection wire 18 which connects a contact 19 of the front face of the emitting circuit chip 14 and a contact 20 of the front face 3 of the substrate slice 2.

According to a particular example embodiment, the substrate slice 2 is rectangular, the receiving integrated circuit chip 6 is rectangular and extends longitudinally along the longitudinal axis of the substrate slice 2 and the emitting chip 14 is also placed along the longitudinal axis of the substrate slice 2. The main optical sensor 9, the secondary optical sensor 10 and the optical emitter 17 are also placed along the longitudinal axis of the substrate slice 2, the optical emitter 17 being on the side of the secondary optical sensor 10.

The electronic package 1 comprises an opaque rigid case 21, in the shape of a basin, which comprises a bottom 22 and a peripheral wall 23 and which covers the receiving chip 6 and the emitting chip 14 at a distance. The edge of the peripheral wall 23 is fixed onto the front face 3 of the substrate slice 2 for example by the intermediary of a layer of opaque adhesive.

The case 21 can be formed by a bottom 22 originating from a plate of laminated material and a peripheral wall 23 in the shape of a frame, originating from a plate of the same material, pierced and attached to the bottom 22 by the intermediary of a layer of adhesive.

The bottom 22 of the case 21 has a main opening 24 situated above the main optical sensor 9 of the receiving chip 6 and a secondary opening 25 situated above the optical emitter 17 of the emitting chip 14. This secondary opening 25 is thus offset laterally with respect to the secondary optical sensor 10, the bottom 22 extending over this secondary optical sensor 10.

The electronic package 1 comprises a chip 26 made of a transparent material, for example made of glass, which is placed above the main optical sensor 9 and in the main opening 24 and, in particular, at a distance from the edges of the latter. The transparent chip 26 is mounted on the front face 8 of the receiving chip 6 by the intermediary of a bonded ring 27, in particular made of an opaque material, which surrounds the main optical sensor 9. The transparent chip 26 could also be fixed to the receiving chip 6 by the intermediary of a layer of transparent adhesive.

The electronic package 1 furthermore comprises a medium in the form of an encapsulation bead or barrier 28 made of an opaque material, for example an epoxy resin, which is interposed, substantially in an annular shape, between the front face 8 of the receiving chip 6, the periphery of the transparent chip 26 and the bottom 22 of the case 21.

Thus, the opaque bead 28 passes between the main optical sensor 9 and the secondary optical sensor 10 of the receiving chip 6 and determines a chamber 29 in which are placed the secondary optical sensor 10 and the optical emitter 17 of the emitting chip 14, such that this chamber 29, and consequently the secondary optical sensor 10 and the optical emitter 17, are optically isolated from the main optical sensor 9 and from the opening 24 open towards the exterior and such that the secondary opening 25 opens into the chamber 29. The opaque bead 28 can extend in the space between the edges of the opening 24 and the periphery of the transparent chip 26 such as to obstruct this space and form a fluid-tight protection.

The electronic package 1 also comprises an encapsulation medium 30, made of a transparent material, for example an epoxy resin, which is placed in the chamber 29 and in which the emitting chip 14 is embedded. The transparent medium 30 can fill the chamber 29 at least partially and can extend above the secondary optical sensor 10 of the receiving chip 6 and can extend as far as the bottom 22 of the case 21, in particular in order to obstruct the secondary opening 25 of the case 21 such as to form a fluid-tight protection of the chamber 29.

The electronic package 1 operates as follows. The light radiation emitted by the optical emitter 17 of the emitting integrated circuit chip 14 is emitted into the material of the transparent encapsulation medium 30, is diffused in this medium 30 and is diffused to the exterior through the secondary opening 25 of the case 21. The light radiation, which is diffused in the transparent encapsulation material 23, also reaches the secondary optical sensor 10 of the receiving chip 6.

Thus, the secondary optical sensor 10 of the receiving chip 6 receives light radiation primarily coming from the optical emitter 17 and secondarily coming from the exterior through the secondary opening 25, the signal coming from the secondary optical sensor 10 being able to form a reference for the analysis of the signal coming from the main optical sensor 9 of the receiving chip 6.

Moreover, the main optical sensor 9 of the receiving chip 6 receives the external light radiation through the transparent plate 26. The main optical sensor 9 can comprise two sensors one of which would be useful for detecting the external ambient light and the other one of which would be useful for detecting the light coming, after reflection on a body, from the optical emitter 17 of the emitting chip 14.

The bottom 22 of the case 21 can be covered, at least opposite the secondary optical sensor 10 and the optical emitter 17, in the chamber 29, with a light-reflecting layer.

As a result of the above, the electronic package 1 can be used as a proximity detector.

The electronic package 1 can be obtained by a batch manufacturing procedure which will now be described.

Figure 4:
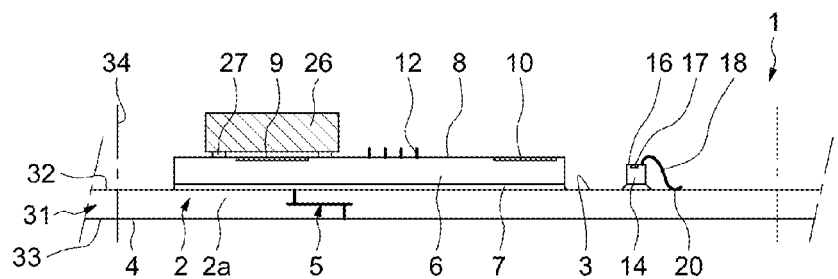
FIGS. 4 to 7 show manufacturing stages of the electronic package of FIG. 1.
Figure 5:
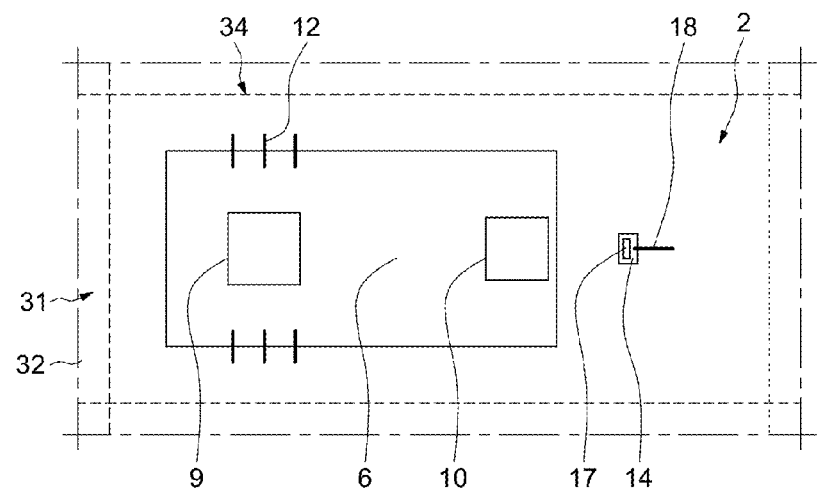

As shown in FIGS. 4 to 5, a batch substrate slice 31 is available having front and rear faces 32 and 33, and having a plurality of adjacent locations 34 established in a matrix arrangement and corresponding to a plurality of electronic packages 1 to be produced. In each location 34, the batch substrate slice 31 comprises an electrical connection network 5.

In each location 34, there is installed the receiving chip 6 and an emitting chip 14 and the electrical connection wires 12 and 18 are placed.

Then, a transparent chip 26 is installed above the main optical sensor 9 of each receiving chip 6.

Figure 6:
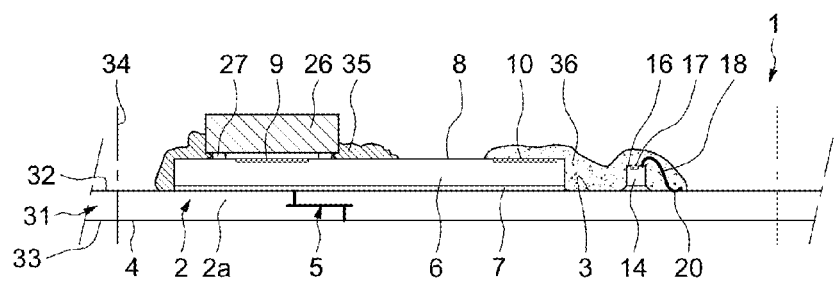

Then, as shown in FIG. 6, in each location 34 there is placed an annular bead 35 made of an opaque liquid material intended for the formation of the opaque encapsulation bead 28 and there is placed a drop of transparent liquid material 36 intended for the formation of the transparent encapsulation medium 30. The above materials can be adhesives which harden under the effect of ultraviolet radiation and/or heat.

Figure 7:
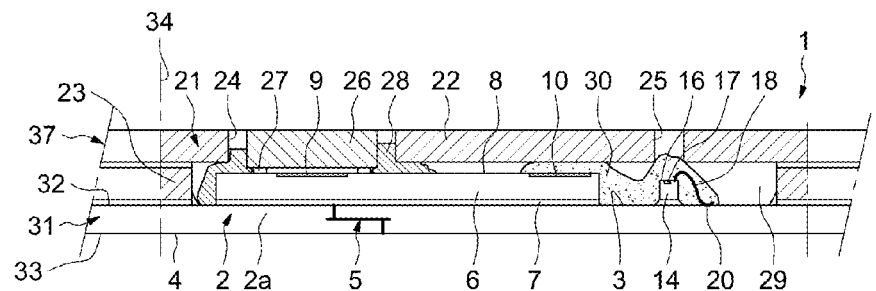

Then, as shown in FIG. 7, a batch plate 37, manufactured in order to comprise a case 21 in each location 34, is put into position. Having done this, the bead 35 and the drop 36 are slightly crushed, in such a way as to form the opaque encapsulation bead 28 and the transparent encapsulation medium 30 respectively. Then, the opaque encapsulation bead 28 and the transparent encapsulation medium 30 are processed appropriately in order to cause their hardening.

According to a variant embodiment, previously manufactured individual cases, for example resulting from batch manufacturing, could be respectively installed on the locations 34.

Then, possibly after having installed electrical connection elements on the rear face of the batch plate 31, in such a way as to form electrical connection elements on the rear faces 4 in each location, the different electronic packages 1 are separated by cutting out along the edges of the locations 34.

Figure 8:
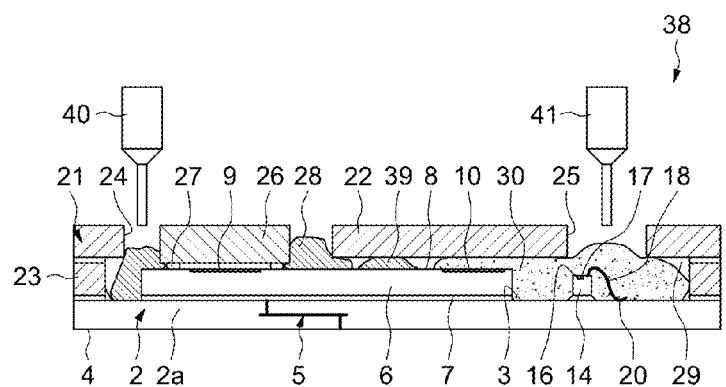
FIG. 8 shows a longitudinal cross-section of another electronic package.

Referring now to FIG. 8, it can be seen that another electronic package 38 has been shown which differs from the electronic package 1 by the fact that an optical isolation bead or barrier 39 made of opaque material, substantially U-shaped, passes between and at a distance from the sensors 9 and 10 of the receiving chip 6 and is interposed on the one hand between the front face 8 and the opposite edges of the receiving chip 6 and on the other hand between the bottom and the opposite walls of the case 21. The aforesaid chamber 29 is thus formed on one side of this bead 39.

The optical isolation bead 39 can result from a slightly crushed bead, deposited at the same time as the bead 35 and the drop 36 of the example described with reference to FIG. 6, before the positioning of the plate 37 intended to form the casing 21.

According to another embodiment, it is possible to deposit only a bead intended for the formation of the optical isolation bead 39, before positioning the plate 37, and to position this plate 37. Then, using a syringe 40, it is possible to inject a liquid material into the space between the wall of the main opening 24 of the case 21 and the transparent chip 26 in order to form, after the hardening of this material, the opaque encapsulation bead 28 and, using a syringe 41, it is possible to inject a liquid material into the second opening 25 of the case 21 in order to form, after the hardening of this material, the encapsulation medium 30.

Figure 9:
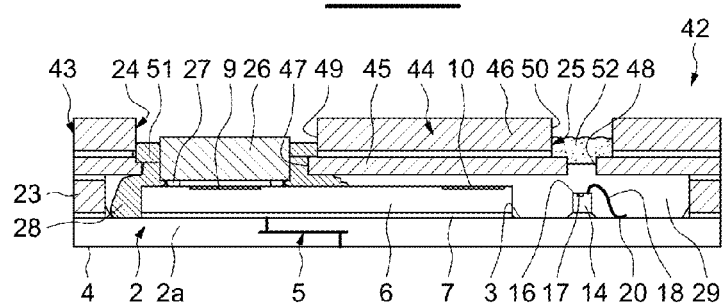
FIG. 9 shows a longitudinal cross-section of another electronic package.

Referring now to FIG. 9, it can be seen that another electronic package 42 has been shown, which differs from the electronic package 1 by the fact that the case 21 is replaced by an equivalent opaque case 43, whose bottom 44 is formed by a first plate 45 and a second external plate 46, bonded onto the first plate 45.

This time, the preceding main and secondary openings 24 and 25 can be formed by main and secondary openings 47 and 48 in the plate 45 and by main and secondary openings 49 and 50 bigger than the main and secondary openings 47 and 48.

According to this example, an opaque annular bead 51 can be added onto the opaque annular bead 28, after installation of the case 43 as previously described with reference to FIGS. 6 and 7, this bead 28 being deposited using a syringe. According to a variant embodiment, the bead 28 and the bead 51 could result from a deposit according to the deposit described with reference to FIG. 8.

Moreover, the transparent medium 30 of the preceding example being present or non-existent, after the positioning of the case 43, a transparent encapsulation medium 52 is formed in the secondary opening 50 of the second plate 46, by depositing a drop using a syringe and subsequent hardening of this drop, this drop being able to overflow into the secondary opening 48 of the first plate 45 and possibly into the chamber 29.

In general, the different manufacturing steps described can be obtained by using the conventional means used in the field of microelectronics.

The electronic packages which have just been described could be installed inside the casing or shell of a portable or mobile telephone having openings opposite optical emitters and main optical sensors, in such a way as to form proximity detectors capable of detecting the presence or absence of an object or of a part of the human body, in order to generate a particular instruction in the electronic circuits of the telephone.

Figure 10:
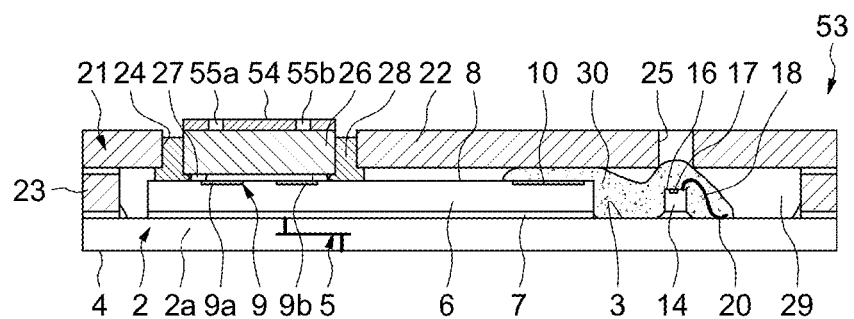
FIG. 10 shows a longitudinal cross-section of another electronic package.

According to a variant embodiment illustrated in FIG. 10, an electronic package 53 is shown, which differs from the electronic package 1 only by the fact that the main integrated optical light radiation sensor 9 comprises two spaced-apart sensitive zones 9a and 9b and the front face of the transparent chip 26 is covered with an opaque layer 54 in which two openings 55a and 55b are formed, these openings 55a and 55b being situated in front of the sensitive zones 9a and 9b of the main sensor 9. In this case, the opaque bead 28 can extend to the periphery of the opaque layer 54.

Figure 11:
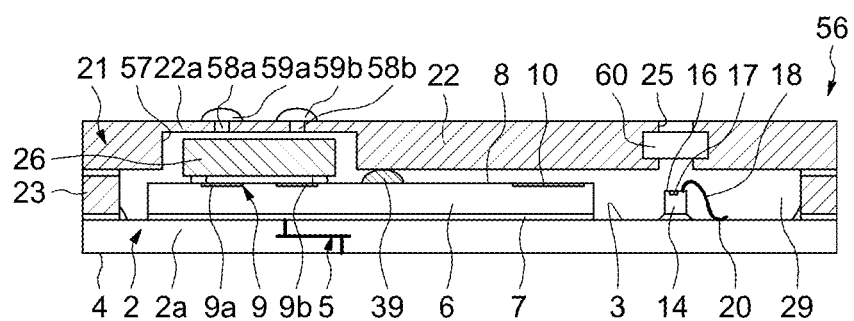
FIG. 11 shows a longitudinal cross-section of another electronic package.

According to a variant embodiment illustrated in FIG. 11, an electronic package 56 is shown, which differs from the electronic package 1 only by the following dispositions.

The main integrated optical light radiation sensor 9 comprises two spaced-apart sensitive zones 9a.

The opaque bead 28 is deleted. The opening 24 of the bottom 22 of the opaque case 21 does not exist and this bottom 22 comprises a portion 22a which extends at a distance in front of the front face of the transparent chip 26. The transparent chip 26 is inserted at a distance in a recess 57 of the bottom 22. The portion 22a comprises two openings 58a and 58b which are situated in front of the sensitive zones 9a and 9b of the main sensor 9.

For a protection against moisture and dust, the openings 58a and 58b can be covered with drops 59a and 59b of transparent material, which can be replaced by a transparent plate.

Furthermore, as in the case of FIG. 8, an opaque bead or barrier 39 can be formed for optically separating the chamber 29 in which are placed the secondary optical sensor 10 and the emitting chip 14 and the chamber in which the main sensor 9 is placed.

As a variant embodiment, the transparent chip 26 can be fixed on the inner face of the portion 22a of the bottom 22 of the opaque case 21, previously to the mounting of the case 21, without fixing on the receiving circuit chip 6 or with interposition of a transparent layer between the rear face of the transparent chip 26 and the front face of the receiving circuit chip 6.

As another variant embodiment, the transparent chip 26 can be fixed on the outer face of the portion 22a of the bottom 22 of the opaque case 21. In this case, this portion 22a extends close to the front face of the receiving circuit chip 6 and the transparent chip 26 can be inserted in a front recess of the portion 22a.

Otherwise, in the variant embodiment of FIG. 11, the transparent encapsulation medium 30 does not exist and is replaced by a small transparent chip 60 on or in the opening 25. For an example, the periphery of the transparent chip 60 can be inserted in the wall of the opening 25 during the molding of the opaque case 21.

The present invention is not limited to the examples described above. In particular it is immediately possible to combine different arrangements of the described electronic packages in different ways. Many other variant embodiments are possible without departing from the scope defined by the appended claims.

What is claimed is:

1. An electronic package, comprising:
    a substrate slice having a front face and a rear face;
    an emitting integrated circuit chip having a rear face fixed onto the front face of the substrate slice and comprising an optical light radiation emitter;
    a receiving integrated circuit chip having a rear face fixed onto the front face of the substrate slice and comprising at least one main optical light radiation sensor and a secondary optical light radiation sensor;
    a case having a bottom and a peripheral wall, said case covering said emitting integrated circuit chip and receiving integrated circuit chip at a distance, an edge of the peripheral wall being fixed to the front face of the substrate slice, the bottom of the case having a main opening above the main optical light radiation sensor and a secondary opening above the optical light radiation emitter;

a bead of an opaque material interposed between the case and the receiving integrated circuit chip and passing between the main optical light radiation sensor and the secondary optical light radiation sensor and delimiting a chamber containing the secondary optical light radiation sensor and the optical light radiation emitter, said bead of opaque material optically isolating chamber from the main optical light radiation sensor and the main opening;

wherein said secondary opening emerges into said chamber.

2. The electronic package according to claim 1, wherein the case comprises a frame fixed onto the substrate slice and forming said peripheral wall; and a plate fixed onto this frame and forming said bottom.

3. The electronic package according to claim 1, wherein the bottom of the case comprises a first plate fixed onto the frame and a second plate fixed onto the first plate.

4. The electronic package according to claim 3, wherein the second plate comprises additional main and secondary openings larger than the main and secondary openings of the first plate.

5. The electronic package according to claim 1, further comprising a transparent chip mounted above the main optical sensor in the main opening.

6. The electronic package according to claim 5, wherein bead obstructs a space between the main opening and the transparent chip.

7. The electronic package according to claim 1, further comprising a transparent medium encapsulating the emitting chip.

8. The electronic package according to claim 7, wherein the transparent medium obstructs the secondary opening of the case.

9. The electronic package according to claim 1, further comprising a shell of a device having at least one opening situated at least opposite at least one of said main and secondary openings.

10. The electronic package according to claim 9, wherein the device is a portable or mobile telephone device.

11. An electronic package, comprising:
a support substrate;
a first integrated circuit mounted to said support substrate, said first integrated circuit having a first optical sensor and a second optical sensor;
a second integrated circuit mounted to said support substrate adjacent the first integrated circuit, said second integrated circuit having an optical emitter;
a case including a peripheral wall surrounding the first and second integrated circuits and a cover, said cover including a first opening above said first optical sensor, said cover further including a second opening above said optical emitter, said cover extending over said second optical sensor; and
an opaque medium inserted under the cover and isolating the second optical sensor from the first optical sensor and defining a cavity within which the second optical sensor and optical emitter are located.

12. The electronic package of claim 11, further comprising a transparent medium inserted under the cover and extending over the second optical sensor and optical emitter.

13. The electronic package of claim 12, said transparent medium filling at least a portion of said second opening.

14. The electronic package of claim 11, further comprising a transparent plate attached to said first integrated circuit over the first optical sensor; said opaque medium surrounding the transparent plate.

15. The electronic package of claim 11, further comprising a second cover mounted to said cover of the case, said second cover including a third opening above and larger than said first opening, and a fourth opening above and larger than said second opening.

16. The electronic package of claim 15, further comprising a transparent medium at least partially filling said second and fourth openings.

17. The electronic package of claim 15, wherein said opaque medium at least partially fills said first and third openings.

18. The electronic package of claim 11, further comprising a transparent plate mounted on or in said second opening.

19. The electronic package of claim 11, wherein the first opening above said first optical sensor comprises a pair of openings and said first optical sensor comprises an associated pair of optical sensors.

20. The electronic package of claim 11, further comprising a transparent plate attached to said first integrated circuit over the first optical sensor and an opaque layer with at least one opening mounted over the transparent plate.

21. The electronic package of claim 20, where the opaque layer includes at least one opening.

22. The electronic package of claim 11, further comprising a transparent sealing medium filling said first opening above said first optical sensor.

* * * * *